(12) United States Patent  (10) Patent No.: US 9,425,788 B1
Jin et al.  (45) Date of Patent: Aug. 23, 2016

(54) CURRENT SENSORS AND METHODS OF IMPROVING ACCURACY THEREOF

(71) Applicant: Infineon Technologies Austria AG, Villach (AT)

(72) Inventors: Minghao Jin, Villach (AT); Oliver Blank, Villach (AT); Quaglino Roberto, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/661,960

(22) Filed: Mar. 18, 2015

(51) Int. Cl.
*H03K 5/003* (2006.01)
*H03K 17/687* (2006.01)
*H01L 27/088* (2006.01)
*H01L 29/40* (2006.01)

(52) U.S. Cl.
CPC ............ *H03K 17/687* (2013.01); *H01L 27/088* (2013.01); *H01L 29/402* (2013.01)

(58) Field of Classification Search
USPC ......... 327/50–51, 80–81, 306, 313, 323–324, 327/327–328; 257/231, 234
See application file for complete search history.

(56) References Cited

U.S. PATENT DOCUMENTS

| | | | |
|---|---|---|---|
| 4,614,959 A | 9/1986 | Nakagawa | |
| 4,630,088 A | 12/1986 | Ogura et al. | |
| 4,811,191 A * | 3/1989 | Miller | G01R 19/22 327/104 |
| 4,890,144 A | 12/1989 | Teng et al. | |
| 5,156,992 A | 10/1992 | Teng et al. | |
| 5,237,193 A | 8/1993 | Williams et al. | |
| 5,242,845 A | 9/1993 | Baba et al. | |
| 5,250,450 A | 10/1993 | Lee et al. | |
| 5,514,608 A | 5/1996 | Williams et al. | |
| 5,578,508 A | 11/1996 | Baba et al. | |
| 5,923,202 A * | 7/1999 | Merrill | H01L 27/0251 327/318 |
| 5,973,360 A | 10/1999 | Tihanyi | |
| 5,998,833 A | 12/1999 | Baliga | |
| 6,376,313 B1 | 4/2002 | Goebel et al. | |
| 8,451,028 B2 * | 5/2013 | Chen | H03K 3/0375 327/199 |

FOREIGN PATENT DOCUMENTS

| | | |
|---|---|---|
| DE | 19611045 C1 | 5/1997 |
| JP | 05007002 | 1/1993 |
| JP | 09181311 | 7/1997 |

OTHER PUBLICATIONS

Benchmarq, "High-Side Current Sensing with BenchMarq's Fast-Charge Control ICs," Oct. 1997, pp. 1-3.
Bode, P. A., "AN39 Current measurement applications handbook," Zetex Semiconductor, Issue 5, Jan. 2008, pp. 1-42.
Long, R. D., et al., "Surface Preparation and Deposited Gate Oxides for Gallium Nitride Based Metal Oxide Semiconductor Devices," Materials 2012, vol. 5, Jul. 24, 2012, pp. 1297-1335.
Luca, A.M., "Current Sensing Accuracy Improvement by Feedback Offset Cancelation," vol. 12, No. 3, 2009, pp. 354-365.

(Continued)

*Primary Examiner* — An Luu
(74) *Attorney, Agent, or Firm* — Slater Matsil, LLP

(57) ABSTRACT

A method for operating a circuit includes providing a three terminal main transistor and a four terminal sense transistor having a field plate. The method includes simultaneously applying a gate pulse on a gate terminal of the sense transistor and a gate terminal of the main transistor, and applying a field plate pulse on a field plate of the sense transistor. The field plate pulse is synchronous and in phase with the gate pulse.

21 Claims, 18 Drawing Sheets

(56) References Cited

OTHER PUBLICATIONS

Marron, T., "GaN Based FETs for Power Switching Applications," Semiconductor Device and Models II, Mar. 13, 2010, pp. 1-10.

Wu, Y.Q., et al., "GaN metal-oxide-semiconductor field-effect-transistor with atomic layer deposited Al2O3 as gatge dielectric," Materials Science & Engineering B, vol. 135, No. 3, Dec. 15, 2006, pp. 282-284.

* cited by examiner

CURRENT SENSORS AND METHODS OF IMPROVING ACCURACY THEREOF

TECHNICAL FIELD

The present invention relates generally to electrical circuits, and, in particular embodiments, to current sensors and methods of improving accuracy thereof.

BACKGROUND

Semiconductor devices are used in many electronic and other applications. Semiconductor devices comprise integrated circuits or discrete devices that are formed on semiconductor wafers by depositing many types of thin films of material over the semiconductor wafers, and patterning the thin films of material to form the integrated circuits.

Electronic switches, such as MOSFETs, IGBTs, or other types of transistors are widely used as electronic switches for switching electrical loads, such as motors, lamps, magnetic valves, and the like. In these applications, the electronic switch is connected in series with the load, where the series circuit with the electronic switch and the load is connected between power supply terminals. The load can be switched on and off by switching the electronic switch on and off.

The load current or the current flowing through the electronic switch is a critical parameter in many applications. This current is measured indirectly by measuring a current through a sense transistor. The sense transistor is biased similar to the main switching transistor but is much smaller in size than the main or load transistor. The load current is obtained by scaling the sense transistor using a suitable scaling algorithm. However, because of various differences between the sense transistor and the main transistor, the ratio of the current flowing through the sense transistor and the main transistor may change during operation and at different operating conditions. Such variations can result in significant variation or error in the computed load current resulting in disastrous consequences.

SUMMARY

In accordance with an embodiment of the present invention, a method for operating a circuit comprises providing a three terminal main transistor and a four terminal sense transistor comprising a field plate. The method includes simultaneously applying a gate pulse on a gate terminal of the sense transistor and a gate terminal of the main transistor, and applying a field plate pulse on a field plate of the sense transistor. The field plate pulse is synchronous and in phase with the gate pulse.

In accordance with an embodiment of the present invention, a circuit comprises a three terminal power transistor and a four terminal sense transistor comprising a field plate. A drain terminal of the four terminal sense transistor is coupled to a drain terminal of the three terminal power transistor. A gate terminal of the four terminal sense transistor is coupled to a gate terminal of the three terminal power transistor. The field plate is capacitively coupled to a drift region of the four terminal sense transistor. The field plate is not coupled to the other terminals of the four terminal sense transistor.

In accordance with an embodiment of the present invention, a method for performing an initialization of a circuit, the method comprising providing a three terminal main transistor and a four terminal sense transistor comprising a field plate. A gate pulse is applied on a gate terminal of the sense transistor and a gate terminal of the main transistor. A ratio of a current through the main transistor and a current through the sense transistor is measured. A field plate bias needed to be applied at the field plate to maintain the ratio of the current through the main transistor to the current through the sense transistor with a target ratio is determined.

In accordance with an embodiment of the present invention, a semiconductor device comprises a three terminal main transistor disposed in a substrate and comprising a source contact, a drain contact, and a gate contact. The main transistor comprises a first plurality of trenches disposed at a front side in a first region of the substrate. Each of the first plurality of trenches comprises a gate line coupled to the gate contact. Portions of each of the first plurality of trenches not filled with material of the gate line comprise a dielectric material. A four terminal sense transistor is disposed in the substrate and comprises a source contact, a drain contact, a gate contact, and a field plate contact. The sense transistor comprises a second plurality of trenches disposed at the front side in a second region of the substrate. Each of the second plurality of trenches comprises a gate line coupled to the gate contact. Each of the second plurality of trenches comprises a field plate line coupled to the field plate contact. The total number of trenches in the second plurality of trenches is different from the total number of trenches in the first plurality of trenches.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A illustrates a cross-sectional view of a semiconductor module comprising a semiconductor chip, wherein FIG. 3B illustrates a top view of a semiconductor chip, and FIGS. 3C and 3D illustrate magnified cross sectional views of the semiconductor chip;

FIGS. 5A and 5B illustrate an alternative embodiment of the present invention of the sense transistor, wherein FIG. 5A illustrates a cross-sectional view while FIG. 5B illustrates a top view of the sense transistor;

FIGS. 7 and 8 illustrate a system on package comprising semiconductor chips in accordance with embodiments of the present invention, wherein FIG. 7 is an analog implementation whereas FIG. 8 illustrates a digital implementation of the embodiments of the present invention.

DETAILED DESCRIPTION OF ILLUSTRATIVE EMBODIMENTS

Integrated switches are replacing the classical relays in an increasing range of applications. The main advantage of integrated solutions is the possibility of integrating the driving and protection functions together with the actual switch, making the control of the power device much easier and increasing the application's robustness.

In many applications, switches are used to connect different type of loads. For example, load types may vary from LED and relays to bulbs and d.c. motors resulting in a wide range of required switch currents and resistances. The switch may be connected between load and ground, commonly referred to as low side switch, or between supply and load, respectively referred to as high side switch.

One of the critical functions required in power devices is the protection against short circuit conditions. Many topologies have been implemented for measuring the load current and protecting the active device, either by switching off or limiting the current. Higher sensing accuracy is generally needed for load diagnosis.

A simple approach to measure the current is to use the switch as a sense resistor. In such a scenario, the voltage drop across the switch can be measured and the load current computed based on this voltage drop. However, the on state resistance of a resistor varies dramatically with temperature, process variation and supply voltage, making this approach inaccurate.

Figure 1:
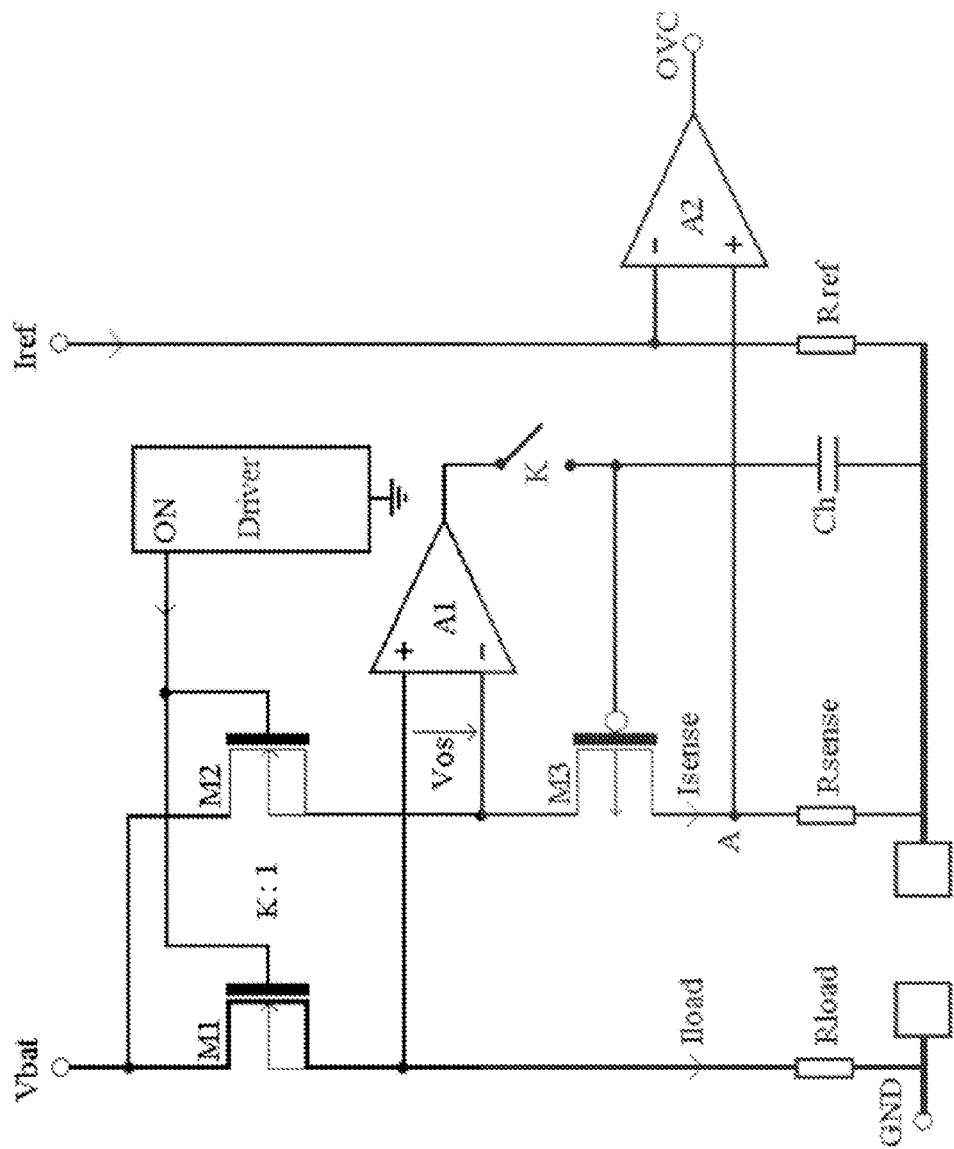
FIG. 1 is an illustration of an example prior art current measurement topology.

Therefore, most current measuring topologies do not measure directly the output current but use a sense transistor to conveniently mirror and scale down this current. FIG. 1 is an illustration of an example current measurement topology and is merely described to explain the importance of adjusting the $K_{ILIS}$ ratio. In this illustration, a high side current sensing topology is described but these can easily be adapted to low side switches as well.

A sense transistor M2 is connected in parallel to the power transistor M1 and ideally the sense current is given by the output load current divided by the geometric ratio between the power transistor M1 and the sense transistor M2.

A sense transistor, M2, is added in parallel to the main power switch, M1, for mirroring a sense current, $I_{sense}$, that is then compared to a threshold. The main power transistor M1 and the sense transistor M2 have their gate and drain connected together. Amplifer A1 forces the source voltages of both transistors to be equal. As a result, main power transistor M1 and the sense transistor M2 are virtually connected in parallel, so the current densities are equal. The ratio between the output and sense current is then given by the multiplicity ratio:

$$I_{load} = K_{ILIS} I_{sense}.$$

The typical $K_{ILIS}$ value is between 1000 and 100,000, depending on the size of the power transistor.

The sense resistor $R_{SENSE}$ is connected in series to the sense transistor M2. As the sense current is typically much lower than the output load current, reasonable sense resistor values can be used. The sense transistor M2 and resistor $R_{SENSE}$ are connected in parallel to the switch M1 so they do not increase the total output resistance.

The sense current is then converted into a voltage, by applying it on the sense resistor $R_{sense}$, and then compared with a reference voltage $V_{ref}$ ($V_{sense} = I_{sense} \times R_{sense}$).

A trimmed reference current is used to generate the comparison voltage, $V_{ref}$, on a reference resistance $R_{ref}$, matched with the $R_{sense}$. When the load current crosses a certain threshold, the sense voltage becomes higher than the reference, so the second comparator A2 signals over current conditions. The threshold condition is provided as follows.

$$V_{sense} = I_{sense} R_{sense} = I_{ref} R_{ref} = V_{ref}$$

The threshold output current results as follows.

$$I_{load} = K_{ILIS} \frac{R_{ref}}{R_{sense}} I_{ref}.$$

The above equation highlights the factors influencing current sensing accuracy: the power to sense transistors ratio, $K_{ILIS}$, the $R_{ref}/R_{sense}$ ratio and the reference current $I_{ref}$. Integrated resistors can be matched with accuracy below 1%, so $R_{ref}/R_{sense}$ ratio is not a major concern for the overall accuracy. A typical integrated current source has a spread of about 20% to 30%, so for precision current detection current trimming is required.

The $K_{ILIS}$ ratio has the biggest impact on current sensing accuracy, as the two matched load and sense transistors have completely different size and geometry, typically work at different temperatures and the matching between power devices is generally poor (compared to low voltage devices).

As a key figure of merit for said technology, $K_{ILIS}$ ratio is required to be accurate, for example, less than ±2%, over a variety of operation conditions. For example, typical junction temperature in field applications such as in automotive industry may range from −40° C. to 150° C.

Conventionally the $K_{ILIS}$ ratio adjustment is embedded in the driver level, for example, by trimming the sense current through a multiplexer, a driver logic, and/or a peripheral interface. Further, the $K_{ILIS}$ ratio is calibrated at a specific temperature (e.g., ambient) for a specific application. In such designs, the sense current is calibrated to a targeted level after assembly test so as to meet $K_{ILIS}$ ratio entitlement at one temperature point. Moreover, the sensor is embedded on the same chip, which has to be sophisticatedly designed to minimize $K_{ILIS}$ ratio distribution against the effects of manufacturing process, layout, package, temperature, current distribution, voltage, and other factors.

One way to circumvent the above the chip-level sensor mismatch issue is to use a system-level tweaking. The nature of offset calibration is merely a compromised approach, which leverages chip sensing error to the entire system. Such approaches require a very delicate system level calibration after assembly (to offset a chip-level sense current), resulting in low yield subsequently. Further, this is a complicated system designed and calibrated on a case-by-case basis, which makes it difficult to modify product features to meet universal requirement. Such a sophisticated chip design, on the other hand, takes extensively long development life cycle as well as enormous engineering work. Further, stringent control is needed through the entire processing, testing, qualification to restrict the specification without compromising system ruggedness and reliability. As a consequence such approaches are frustrated by the financial expense, system complexity and related complexity of the technology, which increase technical and business risks.

Figure 2:
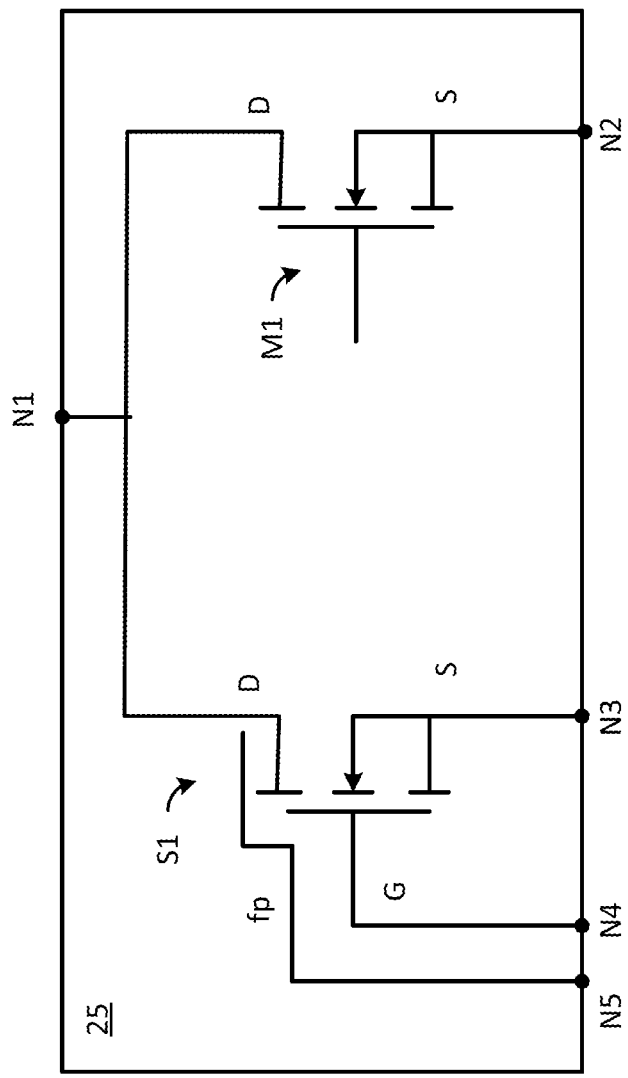
FIG. 2 illustrates a schematic circuit diagram of a semiconductor device in accordance with embodiments of the invention.

Embodiments of the present invention overcome the above problems by improving the sense transistor by the use of additional field plate. The additional field plate is used to overcome the geometric differences between the main power transistor and the sense transistor as will be described in more detail below in various embodiments using FIGS. 2-9. FIGS. 2 and 3 will be used to describe a circuit/semiconductor chip/module. FIGS. 4, 5, and 6 will be used to describe additional details of embodiments of a semiconductor chip while FIGS. 7-8 will be used to describe a circuit for a system of package in accordance with embodiments of the present invention. A method of implementing the embodiment of the present invention will be described using FIG. 9.

FIG. 2 illustrates a schematic circuit diagram of a semiconductor device in accordance with embodiments of the invention.

Referring to FIG. 2, the circuit includes a main transistor M1 and a sense transistor S1 each having a corresponding source (S), drain (D), and a gate (G) node. The common drain terminal N1, the source terminal N2 of the main transistor M1, the source terminal N3 of the sense transistor S1, the common gate terminal N4, and a field plate electrode N5 of the sense transistor S1 form the output nodes of the semiconductor module.

The gate node of the main transistor M1 is tied to the gate node of the sense transistor S1. Similarly, the drain node of the main transistor M1 is tied to the drain node of the sense transistor S1. The source terminal N3 is configured to be coupled to a circuit for measuring a sense current while the source terminal N2 of the main transistor M1 drives the load current. The switching operation is performed by controlling the common gate terminal N4 while the field plate electrode N5 of the sense transistor S1 is used to control the resistance of the sense transistor S1. In various embodiments, the potential or signal applied on the field plate electrode N5 of the sense transistor S1 is synchronous and phase matched with the signal on the common gate terminal N4.

As will be described in various embodiments, the sense transistor S1 and the main transistor M1 are part of a same semiconductor substrate. The various structural implementations of the circuit will be described below.

Figure 3A:
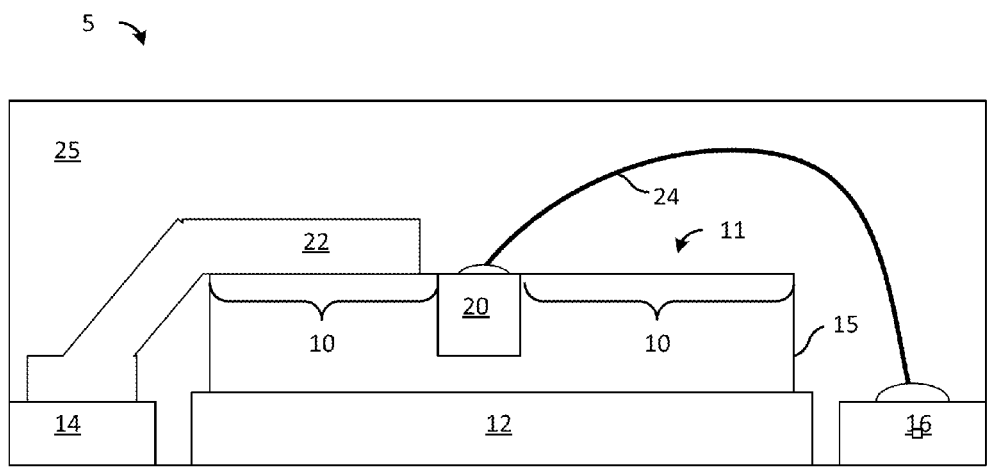
FIGS. 3A-3D illustrates semiconductor devices in accordance with embodiments of the invention.
Figure 3B:
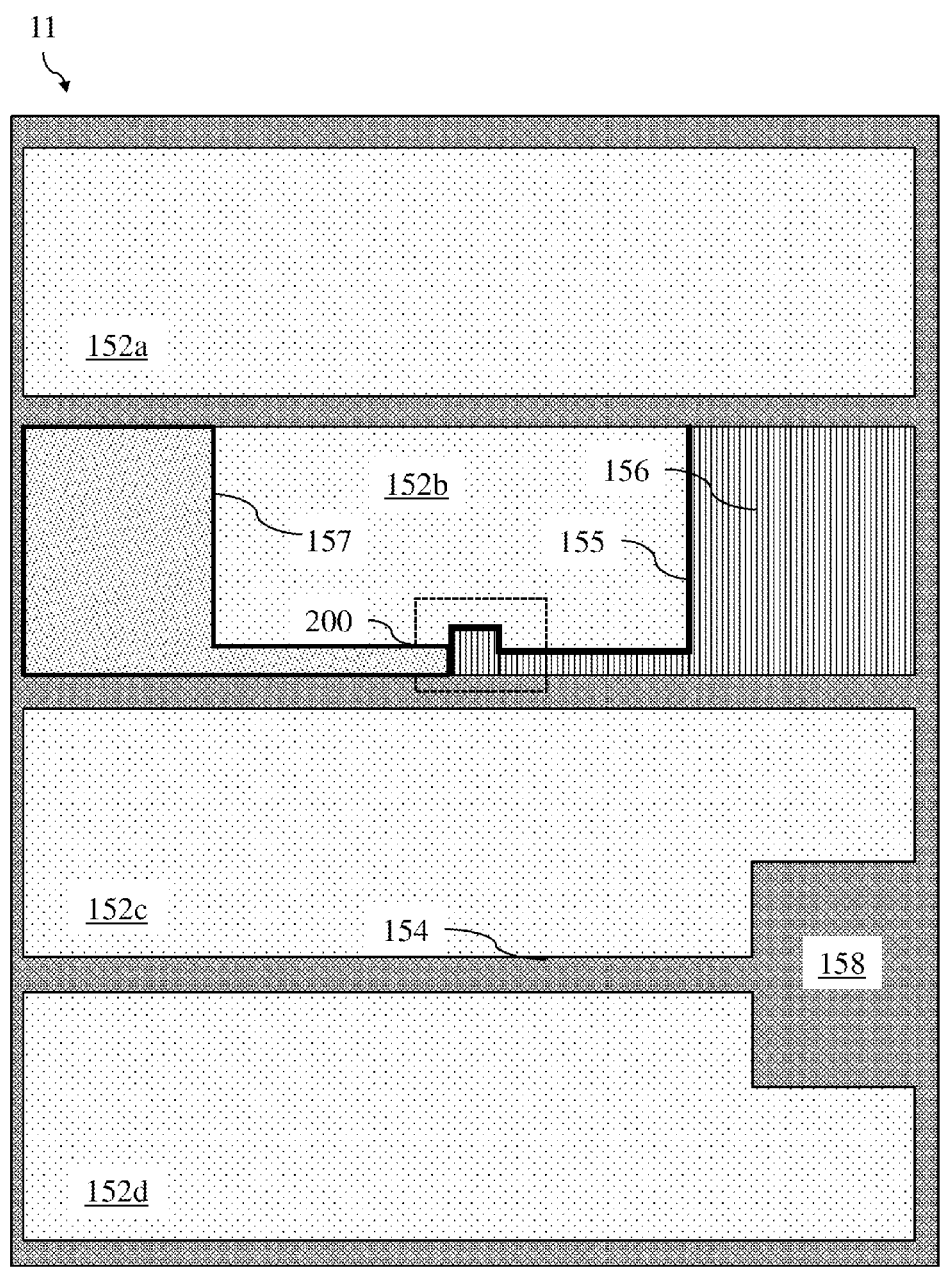
Figure 3C:
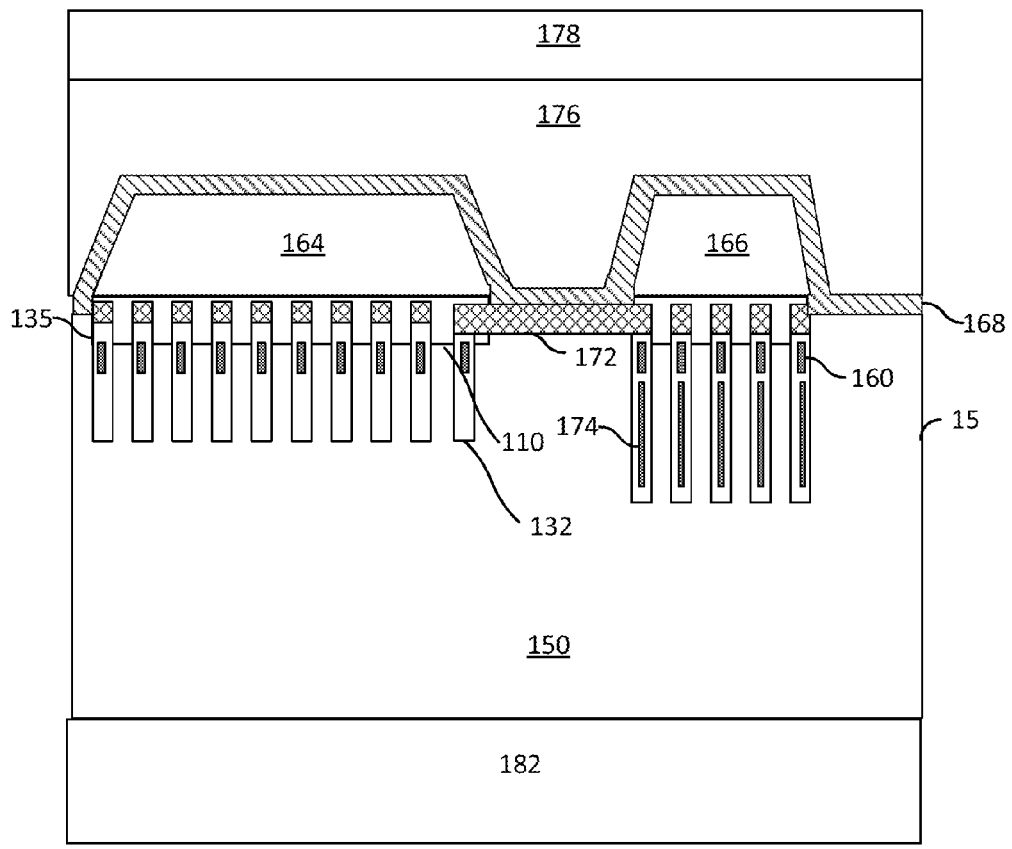
Figure 3D:
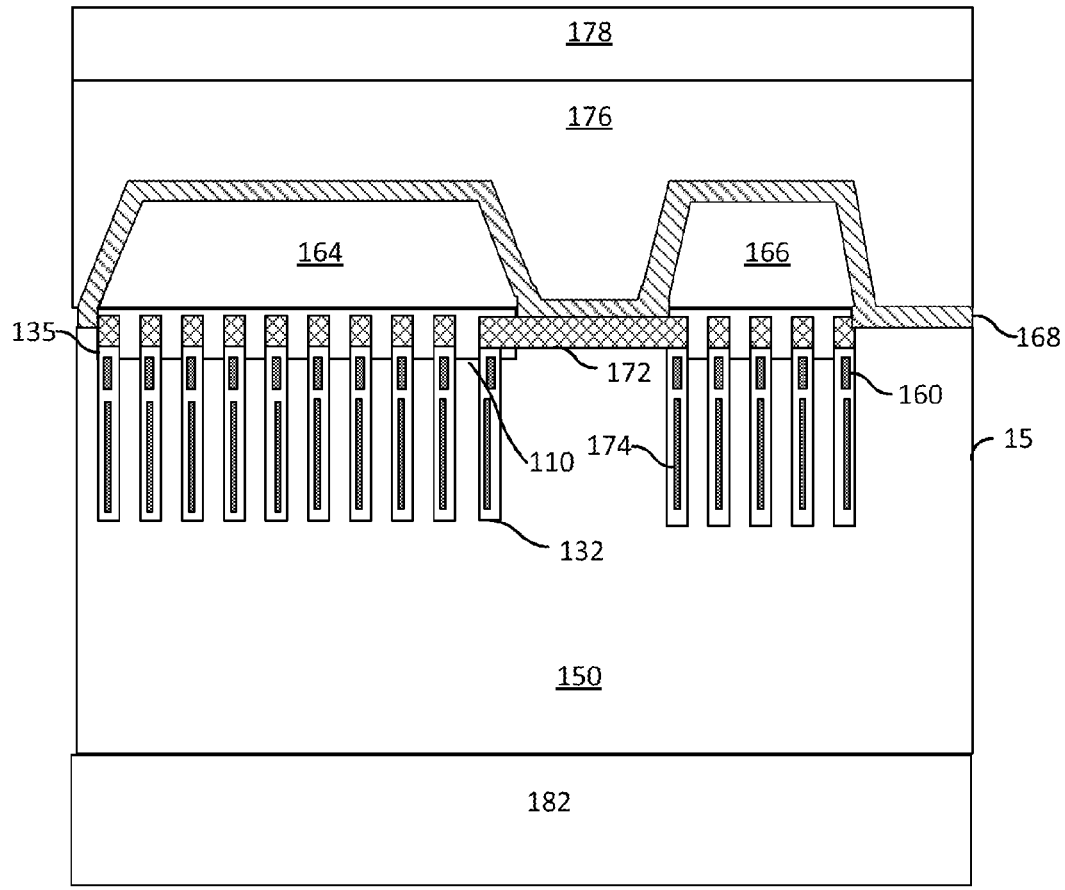

FIGS. 3A-3D illustrates semiconductor devices in accordance with embodiments of the invention. FIG. 3A illustrates a cross-sectional view of a semiconductor module comprising a semiconductor chip, wherein FIG. 3B illustrates a top view of a semiconductor chip, and FIGS. 3C and 3D illustrate magnified cross sectional views of the semiconductor chip.

Referring to FIG. 3A, a semiconductor module 5 comprises a semiconductor chip 11. In one embodiment, the semiconductor chip 11 is a high side power semiconductor chip. The semiconductor module 5 may also include a separate low side chip in some embodiments. As shown in FIG. 3A, the semiconductor chip 11 comprises a main transistor 10 and a sense transistor 20 disposed in a semiconductor substrate 15. The semiconductor substrate 15 may comprise a silicon substrate such as a bulk silicon substrate in various embodiments. Alternatively, the semiconductor substrate 15 may include regions of high band gap materials. For example, the semiconductor substrate 15 may include silicon carbide in one embodiment. In another embodiment, the semiconductor substrate 15 may include gallium nitride or other III-V compounds such as GaN on Si substrates. The main transistor 10 may be a power transistor in one or more embodiments. The power transistor may be a vertical transistor in one embodiment. The power transistor may be a lateral transistor in another embodiment.

The sense transistor 20 is configured to measure a sense current while a load current flows through the main transistor 10. The sense transistor 20, accordingly, consumes a very small region of the substrate 15. The semiconductor chip 11 may be packaged alone or with one or more other semiconductor chips to form the semiconductor module 5.

In various embodiments, the semiconductor module 5 may be any type of package. In one illustration, the package is a lead frame package comprising a die pad 12 and a plurality of leads 14 and 16. The main transistor 10 comprises contact pads that are coupled to one or more of the plurality of leads 14. For example, because of the higher currents flowing through the main transistor 10, clips 22 may be used to couple the contact pads (particularly source contact pad) on the main transistor 10 with the plurality of leads 14. In contrast, the sense transistor 20 may be coupled to the other plurality of leads 16 through wire bonds 24. However, this introduces differences in the resistance through the packaging interconnects that are different for the sense transistor 20 and the main transistor 10. For various applications as described above, the ratio of sense current through the sense transistor 20 and the load current through the main transistor 10 has to be controlled carefully. Embodiments of the present invention may also be mounted using flip-chip technologies.

FIGS. 3B-3D illustrate schematic diagrams of example semiconductor devices (e.g. semiconductor chip 11 in FIG. 3A) used in embodiment measurement systems. According to various embodiments, FIGS. 3B-3D are illustrative examples of a load transistor and sense transistor configuration. These figures are not drawn to scale and omit various details and variations known to those of skill in the art.

FIG. 3B illustrates a top view of semiconductor chip 11 including load source contacts 152a, 152b, 152c, and 152d, gate runners 154, a sense source contact 156, a field plate contact pad 157, and a gate contact pad 158. The load transistor 10 is formed between load source contacts 152a, 152b, 152c, and 152d and drain 150 (shown in FIG. 4E) and is controlled by signals applied through gate runners 154, which is coupled to multiple gate lines 160 (not shown, see FIG. 4D) running beneath gate runners 154. The sense transistor 20 is formed in the same semiconductor substrate 15 underneath the sense source contact 156 and also is controlled by the same signals applied through gate runners 154. Isolation region 155 separates sense source contact 156 from load source contact 152b.

In various embodiments, multiple source contacts may be used of multiple sizes. For illustration, in one example embodiment, four load source contacts 152a, 152b, 152c, 152d are shown, while in various embodiments any number may be included. The ratio of transistor width for the sense transistor to transistor width for the load transistor may be set to the range from 1:1000 to 1:50,000. The ratio may be further narrowed to the range from 1:10,000 to 1:30,000. In alternative embodiments, the ratio may be outside of these ranges.

FIG. 3C illustrates a schematic cross section of the load transistor and the sense transistor. In one or more embodiments, both transistors include a large number of trenches 132 in which gate lines 160 are formed. In various embodiments, there may be a larger number of gate lines 160 in either or both the load transistor and the sense transistor than illustrated. For example, some embodiments may include 10 gate lines 160 in the sense transistor and 10,000 gate lines in the load transistor. Gate lines 160 are separated from load source 164 and sense source 166 by insulation material 172, which may be formed of an oxide, for example. In one or more embodiments, the insulation material 172 may comprise a layer of silicon oxide and boro phospho silicate glass (BPSG).

Doped regions including source regions 110 are formed below sense source 166 and load source 164. In different embodiments, doped regions may be p-type or n-type doped regions and may also include both doped p- or n-wells and higher doped n+ or p+ regions inside the wells, depending on the well and semiconductor dopants. Drain 150 is formed at a back side of the semiconductor substrate 15. A thick back side metal layer 182 is formed on the back side of the semiconductor substrate 15 for the drain contact.

The sense source 166 and load source 164 are coupled to the corresponding source regions through a metallic layer 135 in the substrate 15. In one or more embodiments, the metallic layer 135 may comprise a titanium/titanium nitride metal barrier liner stack followed by a tungsten fill layer. The metallic layer 135 may be selected to provide a good contact to the source regions 110 and minimize Schottky contact resistance. The sense source 166 and load source 164 may comprise aluminum in one or more embodiments. However, in some embodiments, the sense source 166 and load source 164 may comprise copper.

An inter-level insulating dielectric layer 168 is formed over the sense source 166 and load source 164. In various embodiments, the inter-level insulating dielectric layer 168 may comprise silicon oxide, silicon nitride, and other suitable inter level dielectric materials.

A metal level layer 176 is formed over the inter-level insulating dielectric layer 168. In various embodiments, the metal level layer 176 may comprise copper metal lines. A passivation layer 178 is formed over the metal level layer 176. In various embodiments, the passivation layer 178 may include a silicon oxide layer and is designed to protect the underlying metallization and devices.

The metal level layer 176 forms the load source contacts 152a, 152b, 152c, and 152d, while the gate runners 154, the sense source contact 156, the field plate contact pad 157, and the gate contact pad 158 are formed from a metal pad at the same metal level as load source 164 and sense source 166 as illustrated in FIG. 3B.

In various embodiments, only the gate lines 160 in the sense transistor are formed over a field plate electrode 174. This illustrated embodiment is one type of trench gate vertical transistor. In still further alternative embodiments, any type of power transistor with any type of structure may be used. In some embodiments, the load transistor may also include an additional electrode underneath the gate line 160. However, the additional electrode may be electrically coupled to either the gate line itself or to the sense source 166 so that the load transistor is a three terminal device.

According to various embodiments, gate lines 160 control both the sense transistor formed between sense source 266 and drain 150 and the load transistor formed between load source 164 and drain 150. Thus, the sense transistor and load transistor have shared gate and drain connections with separate source connections. Sense source contact and load source contact may be defined by metallization levels, as is apparent to those of skill in the art.

FIG. 3D illustrates a cross-sectional view in which the load transistor also includes field plates. However, unlike the sense transistor, the field plates of the load transistor are coupled to gate or source regions.

FIGS. 4A-4E illustrates magnified views of different regions of the semiconductor chip in accordance with embodiments of the invention and illustrates the power transistor and the sense transistor.

Figure 4A:
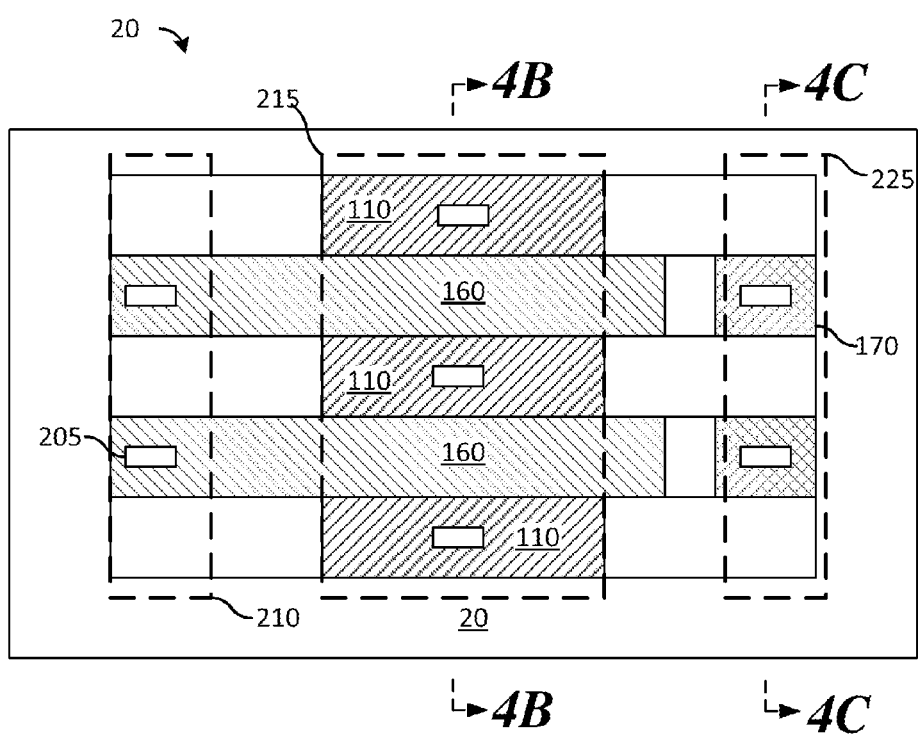
FIGS. 4A-4E illustrate magnified views of different regions of the semiconductor chip in accordance with embodiments of the invention and illustrates the power transistor and the sense transistor.
Figure 4B:
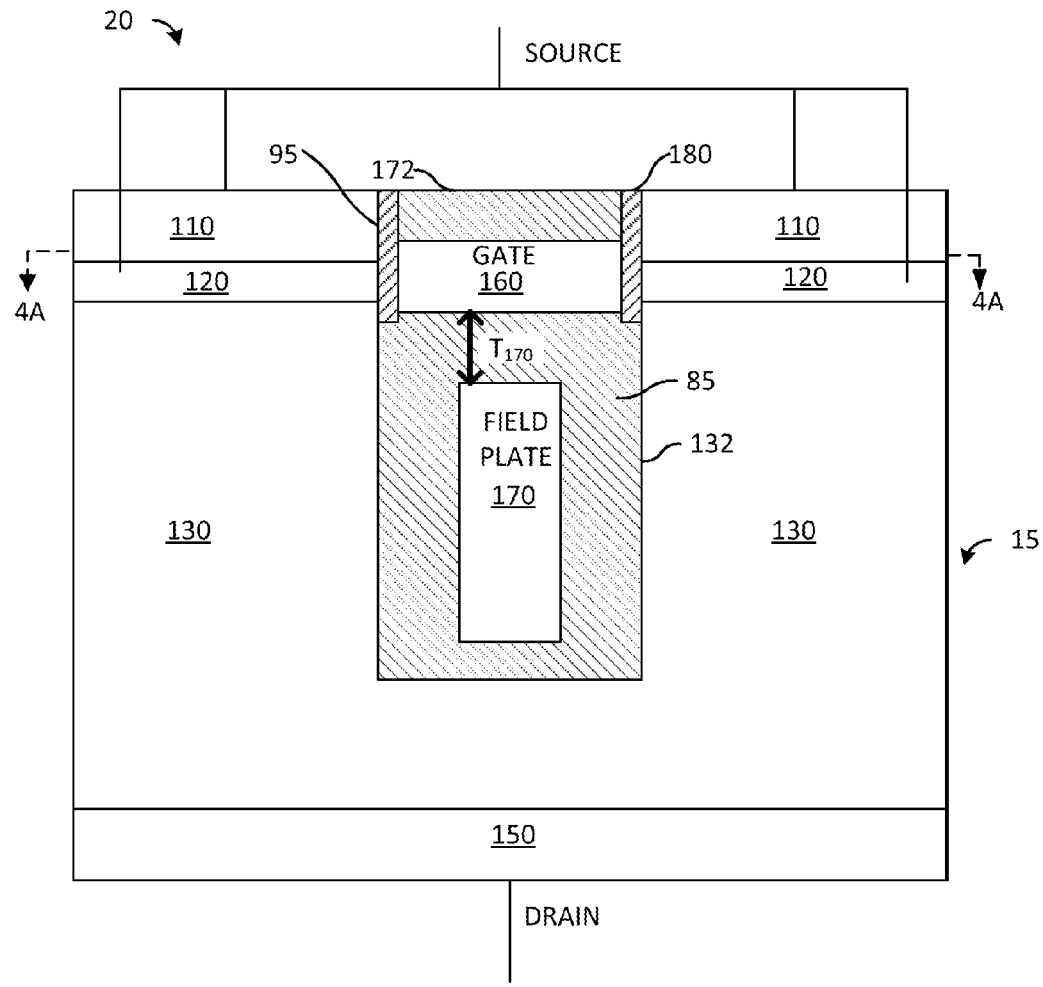
Figure 4C:
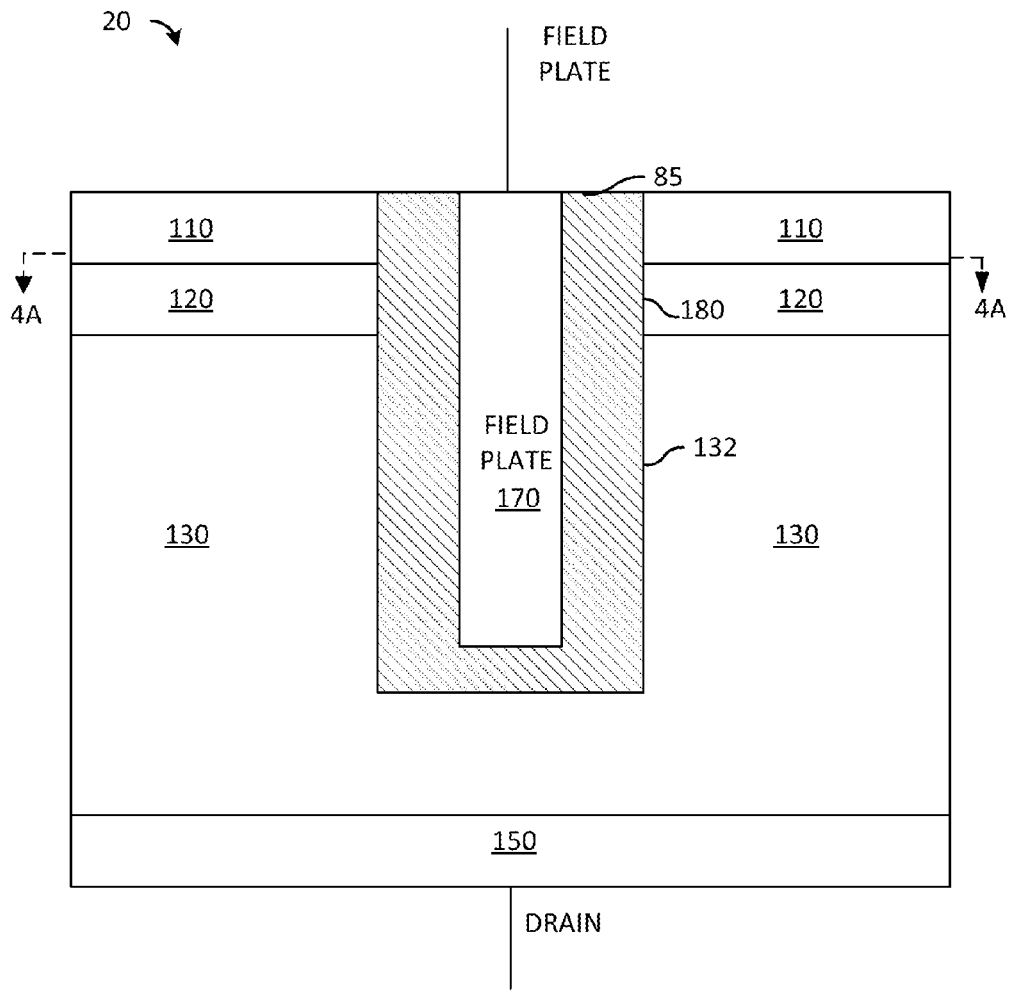

FIG. 4A illustrates a top view of a sense transistor 20 while FIGS. 4B and 4C illustrate cross-sectional views of the sense transistor.

Referring to FIG. 4A, a plurality of sources regions 110 are embedded within a substrate. In case of n-channel field effect transistors, the plurality of sources regions 110 is formed of n-type regions. In case of p-channel field effect transistors, the plurality of sources regions 110 is formed of p-type regions.

A plurality of gate lines 160 are disposed adjacent the plurality of sources regions 110. In one embodiment, the plurality of gate lines 160 may be formed over the substrate. Alternatively, in one or more embodiments, the plurality of gate lines 160 is formed within a trench 132 in the substrate 15 (FIG. 4B). The plurality of gate lines 160 are coupled to upper metal lines (or gate metal 210) through contacts 205. Similarly, the plurality of source regions 110 are coupled to source metal 215 (see, e.g., FIG. 3C).

The plurality of gate lines 160 is capacitively coupled to the body regions 120 through a gate dielectric layer 95. The body regions 120, which form the channel regions, are lower doped regions that are opposite in net doping to the plurality of sources regions 110. Further, the gate dielectric layer 95 may comprise an oxide or nitride layer such as silicon oxide or silicon nitride. In one embodiment, the gate dielectric layer 95 comprises thermal silicon oxide layer. Alternatively, the gate dielectric layer 95 may comprise a high-k dielectric layer.

The gate dielectric layer 95 may comprise a suitable material selected based on the substrate material of the substrate 15 in various embodiments. For example, when the semiconductor substrate material of the substrate 15 comprises gallium nitride (GaN), the gate dielectric layer 95 may comprise aluminum oxide, scanadium oxide, magnesium oxide, titanium oxide, hafnium oxide, gadolinium oxide, lanthanum oxide, zirconium oxide, gallium oxide, gallium oxynitride, silicon nitride, silicon oxide, and others.

In one or more embodiments, the body region 120 may be coupled to the source metal. The plurality of gate lines 160 may be covered by an insulation material 172 (FIG. 4B). A drift region 130 is disposed below the body region 120. The drift region 130 has the same net doping type as the source regions 110 in various embodiments. The drift region 130 is however a lower doped region than the source regions 110 so as to cause a potential drop across. The voltage drop across the drift region 130 prevents breakdown or damage of the gate dielectric layer 95.

In various embodiments, a plurality of field plate regions 170 is also disposed in the trench 132 in the substrate 15. The plurality of field plate regions 170 are disposed below the plurality of gate lines 160 and isolated by the dielectric fill material 85. The thickness $T_{170}$ of the dielectric fill material 85 is controlled so that the capacitive coupling of the gate is minimized in some embodiments. The plurality of field plate regions 170 are coupled to upper metal lines (or the field plate metal 225 in metal level layer 176 of FIGS. 4A and 4C). In various embodiments, the capacitive coupling of the field plate regions 170 to the drift region 130 is smaller than the capacitive coupling of the gate lines 160 to the source regions 110.

As further illustrated in FIG. 4C, the field plate regions 170 may be coupled to a contact in a termination region, where there are no gate lines in the trenches 132. In various embodiments, the field plate region 170 is used to change the resistance of the drift region 130 as will be described further below.

Figure 4D:
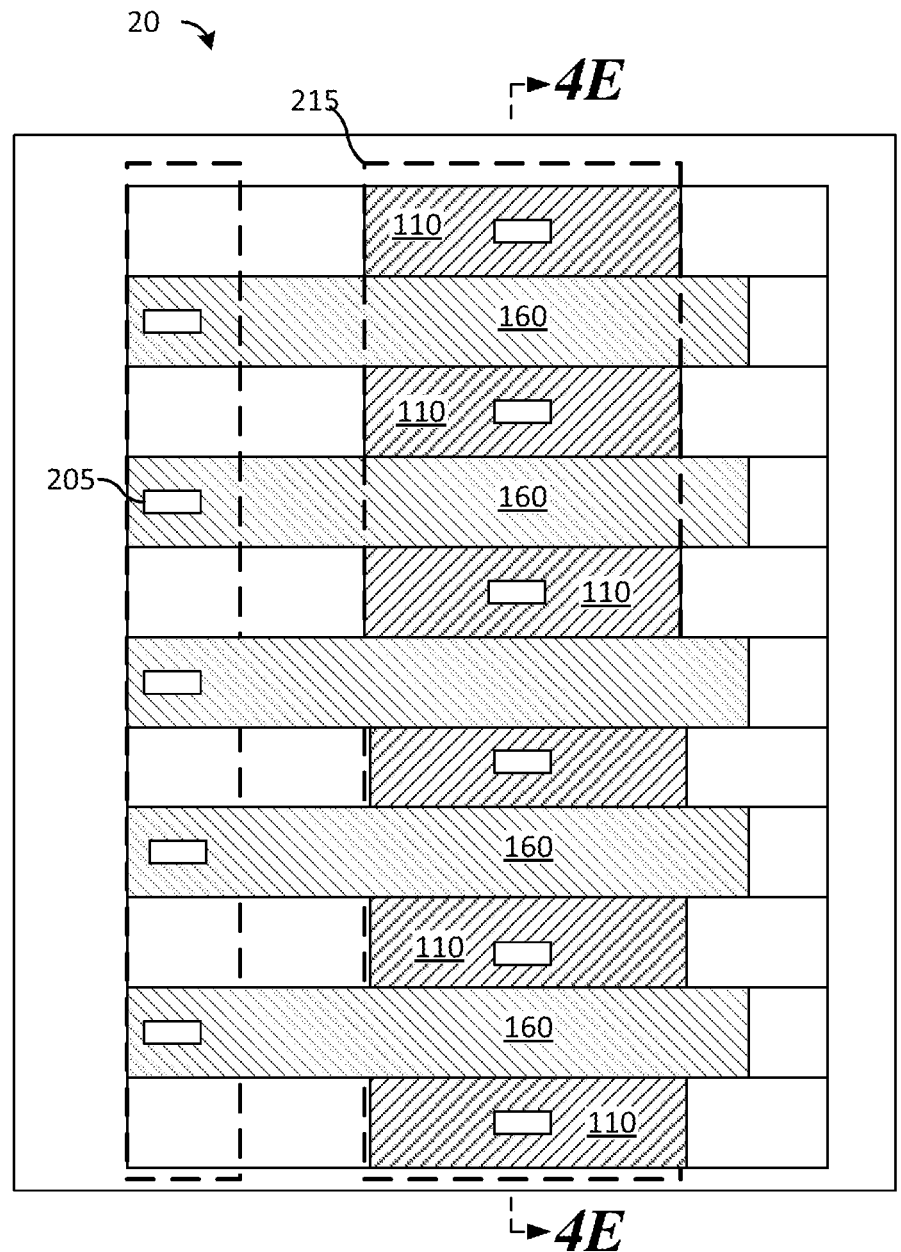
Figure 4E:
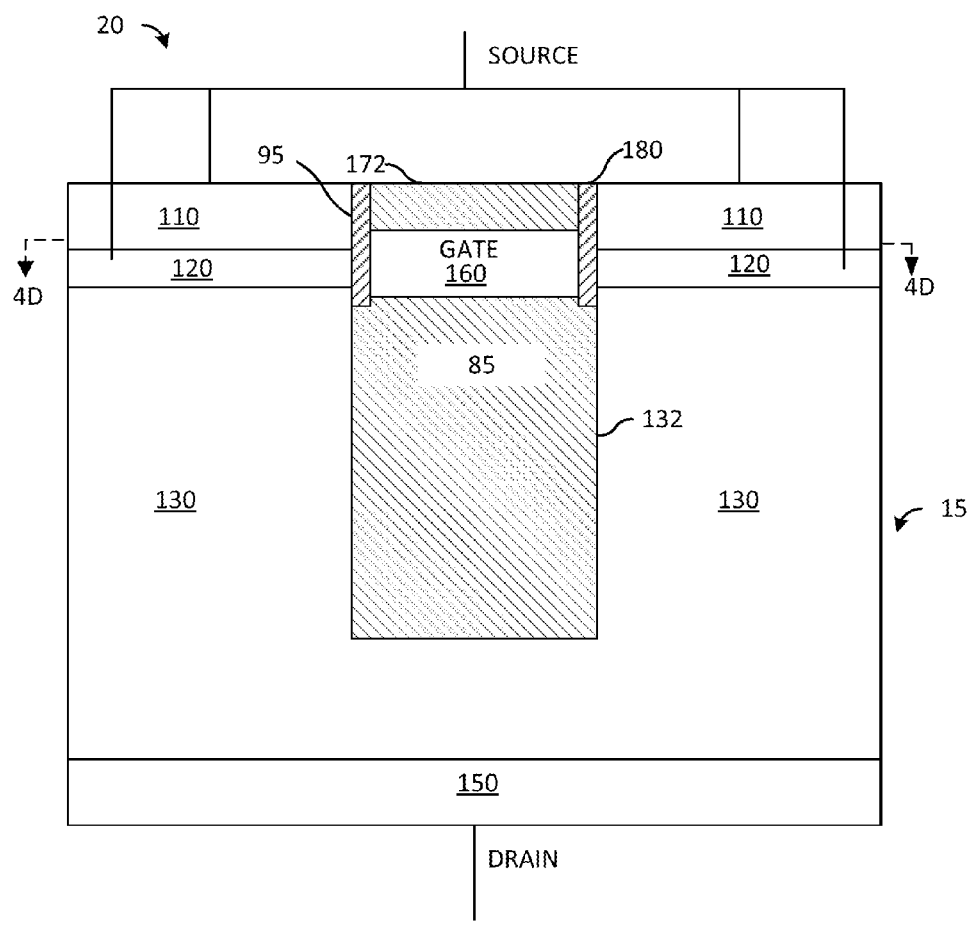

FIG. 4D illustrates a top view of a load transistor 10 while FIGS. 4E and 4F illustrate cross-sectional views of the load transistor.

Unlike the sense transistor, the load transistor includes no separate field plate electrodes. Alternatively, if a field plate is included, it is coupled to the source metal or is part of the gate electrode.

In one or more embodiments, the field plate region 170 of the sense transistor is applied with a potential pulse that is in phase and synchronous with the gate bias. Therefore, when the gate bias forms an inversion region in the body region 120 adjacent the upper sidewall of the trench 132, an accumulation region is formed adjacent the lower sidewall of the trench 132. The formation of the accumulation region results in a decrease in resistance to current flow. However, because the field plate bias is in phase with the gate bias, the field plate is switched off when the gate bias is in ground (OFF state of the transistor). In such a case, the field plate does not decrease the resistance, which would harmfully increase the sub-threshold leakage current.

Additionally, in various embodiments, the field plate pulse may be configured to apply an opposite bias during the OFF state. For example, for an NMOS device, a negative field plate voltage may be applied when the gate bias is at ground or positive. With a negative field plate voltage and an open channel (e.g., gate positive) the resistance of the drift zone is increased whereas with a positive field plate voltage and an open channel the resistance of the drift zone is reduced. Accordingly, modifying the field plate voltage of the Sense FET, in various embodiments, the resistance of the Sense FET is modified, which controls the KILIS. Accordingly, embodiments of the present invention may be used to significantly change the performance of the sense transistor without having any impact on the performance of the main transistor.

Additionally, the change in performance of the sense transistor is used to account for differences in the ratio of geometric differences. This will be described using FIG. 5 below.

Figure 5A:
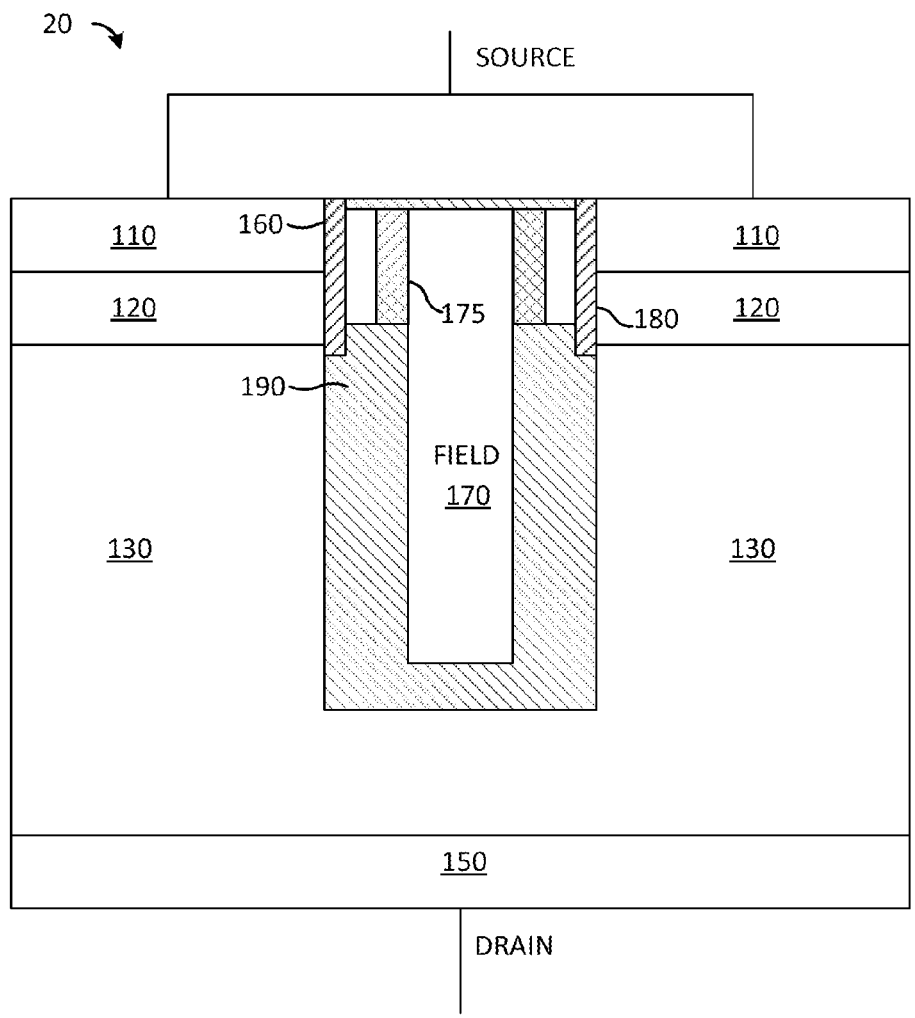
Figure 5B:
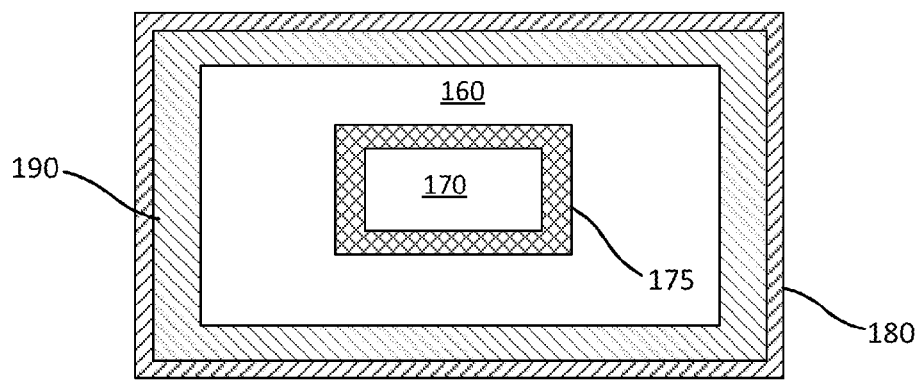

FIGS. 5A and 5B illustrate an alternative embodiment of the present invention of the sense transistor. FIG. 5A illustrates a cross-sectional view while FIG. 5B illustrates a top view of the sense transistor.

In this embodiment, the field plate region 170 extends through the concentric gate lines 160 of the sense transistor. The field plate region 170 is separated from the concentric gate line 160 by a dielectric layer 175.

Figure 6A:
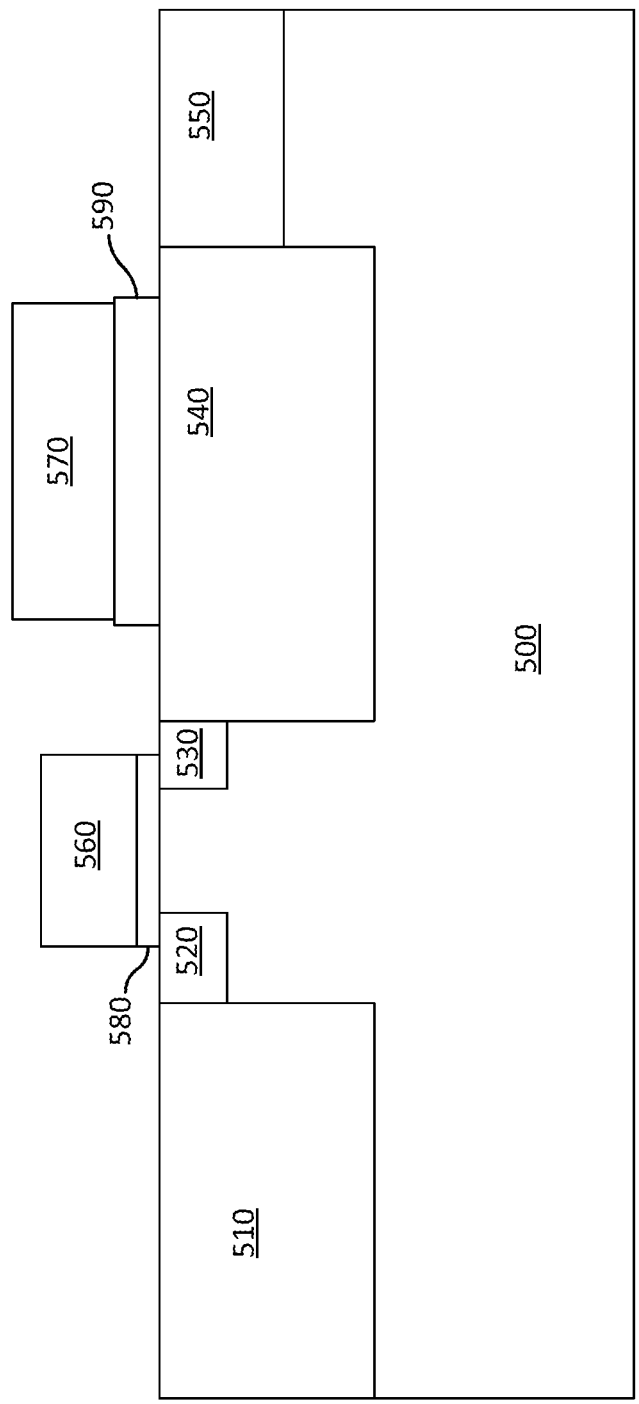
FIGS. 6A and 6B illustrate cross-sectional views of the sense transistor in accordance with an alternative embodiment of the present invention.
Figure 6B:
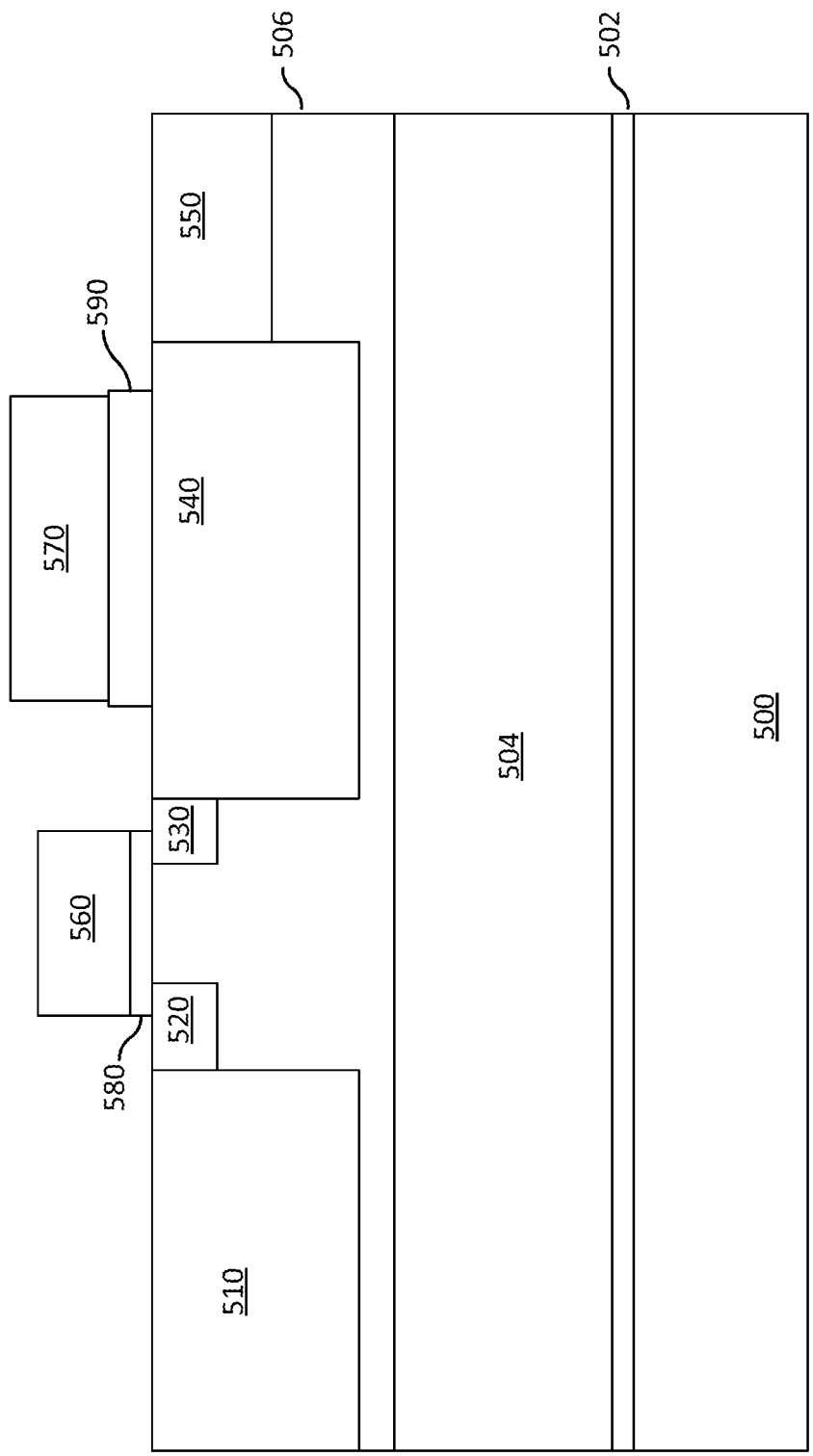

FIGS. 6A and 6B illustrates cross-sectional views of the sense transistor in accordance with an alternative embodiment of the present invention.

In one or more embodiments, the sense transistor and the main load transistor may be implemented as lateral devices with current flowing laterally. Embodiments may include drain extended MOS transistors, Lateral Double-Diffused MOS transistors, Double-Diffused Drain MOS transistors. In one embodiment, lateral power devices may be used in alternative substrate technologies, e.g., in which an epitaxial layer of a high band gap is grown over a semiconductor substrate. For example, in one embodiment, a hetero-epitaxial layer of gallium nitride may be grown over a silicon substrate and the lateral transistor is formed in the gallium nitride layer.

Referring to FIG. 6A, the sense transistor comprises a source 510, a source extension 520, a drain extension 530 separated by a channel region. A gate stack comprising a gate dielectric layer 580 and a gate electrode 560 is disposed over the channel region. An extended drift region 540 is disposed between the drain extension 530 and the drain region 550. In various embodiments, the source 510, the source extension 520, the drain extension 530 and the drain region 550 comprise the same doping type. Usually, the drift region 540 may comprise the same doping as the drain extension 530 and the drain region 550 but may also be counter-doped to increase the resistance of the region so as to drop a larger voltage across the device.

As also illustrated in FIG. 6A, a field plate dielectric 590 may be disposed over the drift region 540. In various embodiments, the field plate dielectric 590 may be deposited oxide, nitride, thermal oxide, and other dielectric materials. A field plate electrode 570 is disposed over the field plate dielectric 590. The field plate electrode 570 may have the same material as the gate electrode 560.

FIG. 6B illustrates an embodiment of a lateral transistor formed within a heteroepitaxial substrate.

The heteroepitaxial substrate may include a buffer layer 502 formed over a silicon substrate followed by a gallium nitride layer 504 and an aluminum gallium nitride layer 506.

The doped regions for source 510, extended source 520, drain extension 530, drift 540, and drain 550 may be adjusted to accommodate process limitations in doping gallium nitride devices. For example, only embedded in-situ doped source and drain regions may be grown by doping AlGaN with silicon in one embodiment. Such regions may be formed by forming recesses in AlGaN layer 506 followed by an epitaxy process.

Embodiments of the invention may be applied to IGBT although for illustration only transistors are shown in various embodiments.

Figure 7:
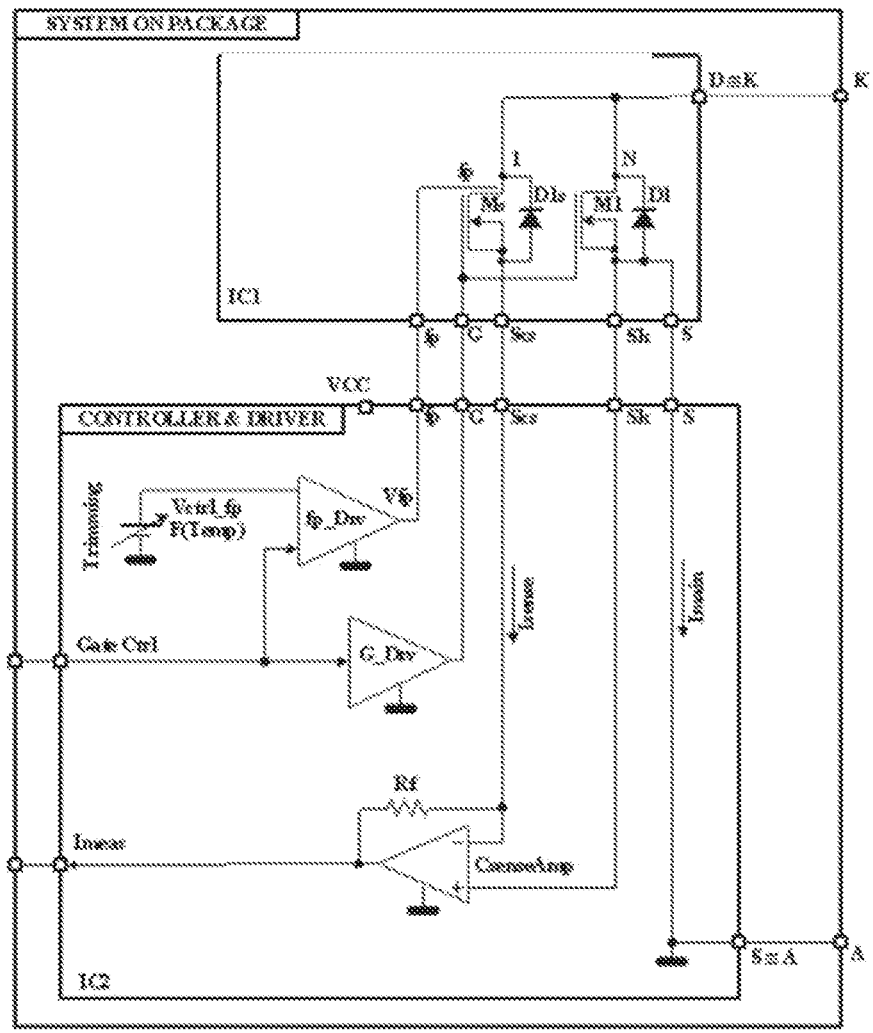
Figure 8:
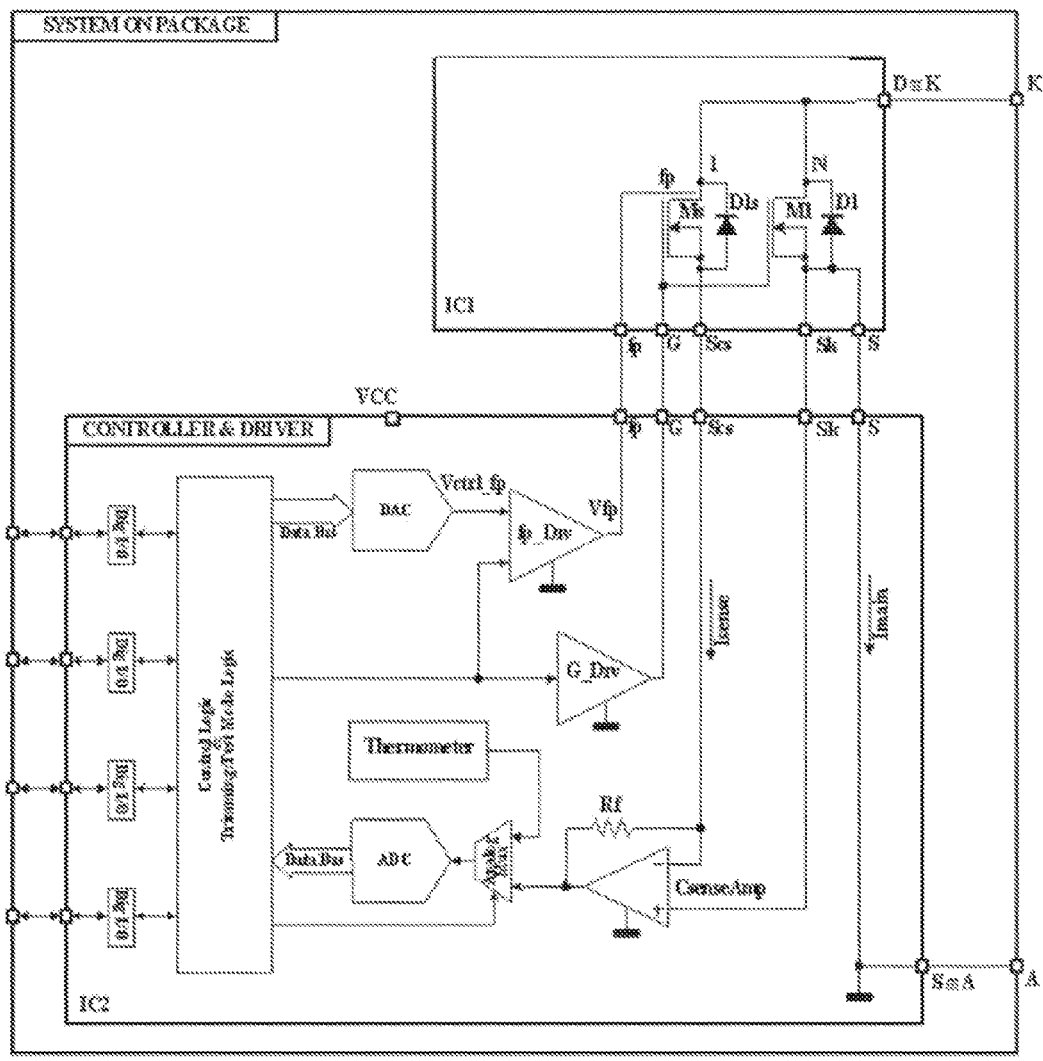

FIGS. 7 and 7 illustrate a system on package comprising semiconductor chips in accordance with embodiments of the present invention. FIG. 7 is an analog implementation whereas FIG. 8 illustrates a digital implementation of the embodiments of the present invention.

Referring to FIG. 7, the system on package includes a first semiconductor chip (IC1) comprising a load transistor M1 and a sense transistor Ms. The first semiconductor chip IC1 is driven by a second semiconductor chip (controller and driver chip). In some embodiments, the first semiconductor chip and the second semiconductor chip may be integrated on a same chip.

The load transistor M1 is a three terminal transistor while similarly, the sense transistor Ms is a four terminal transistor as described in various embodiments. The gates of the load transistor M1 and the sense transistor Ms are tied together through the gate pad G, which is coupled to a gate driver in the controller chip. The drain of the load transistor M1 and the sense transistor Ms are tied together through the drain pad D, which is also an input/output node of the system on package.

The first semiconductor chip (IC1) includes a source output Scs that is coupled to the controller and driver chip. A current sense amplifier (CsenseAmp) takes the sense current from the sense transistor and outputs an amplified measured current representative of the load current (due to the proper $K_{ILIS}$ ratio matching described previously).

Using either embodiment of FIG. 7 or 8, a known current may be set in the power transistor system on package. The output of the Current sense amplifier (CsenseAmp) is a measure of this current. This measure can be read out directly or by using some logic and, based on the read value, the right amount of trimming is determined and set.

In various embodiments, the $K_{ILIS}$ ratio trimming may be carried out in the sensing portion of the sense transistor ($M_s$). The field plate (fp) of the sense transistor Ms is driven by a field plate driver ($fP_{Drv}$), which outputs a field plate voltage $V_{fp}$. The field plate electrode voltage $V_{fp}$ is made to be synchronous and in phase with the gate pulse from the gate driver $G_{Drv}$. Accordingly, the field plate driver $fp_{Drv}$ works closely with the main gate driver $G_{Drv}$, for example, receiving the main gate control (Gate Ctrl) simultaneously with the gate driver $G_{Drv}$.

The field plate driver $fp_{Drv}$ receives as inputs two signals: the main gate command (Gate Ctrl) and a variable voltage reference. The main gate command (Gate Ctrl) is used for synchronization and timing, while the variable voltage reference is used to set the amplitude of the field plate voltage $V_{fp}$. The reference voltage may be set at the appropriate value to correct the $K_{ILIS}$ ratio. As an illustration, in various embodiments, the voltage reference may be adjusted to be temperature dependent and may also be dynamically changed at run time.

FIG. 8 is an illustrative implementation of the above using a digital circuit. For example, the field plate driver $fp_{DRV}$ receives a field plate bias control signal $Vctrl_{fp}$ for setting the pulse amplitude from the logic circuit that performs control logic, trimming, and testing, after a digital to analog conversion.

Figure 9:
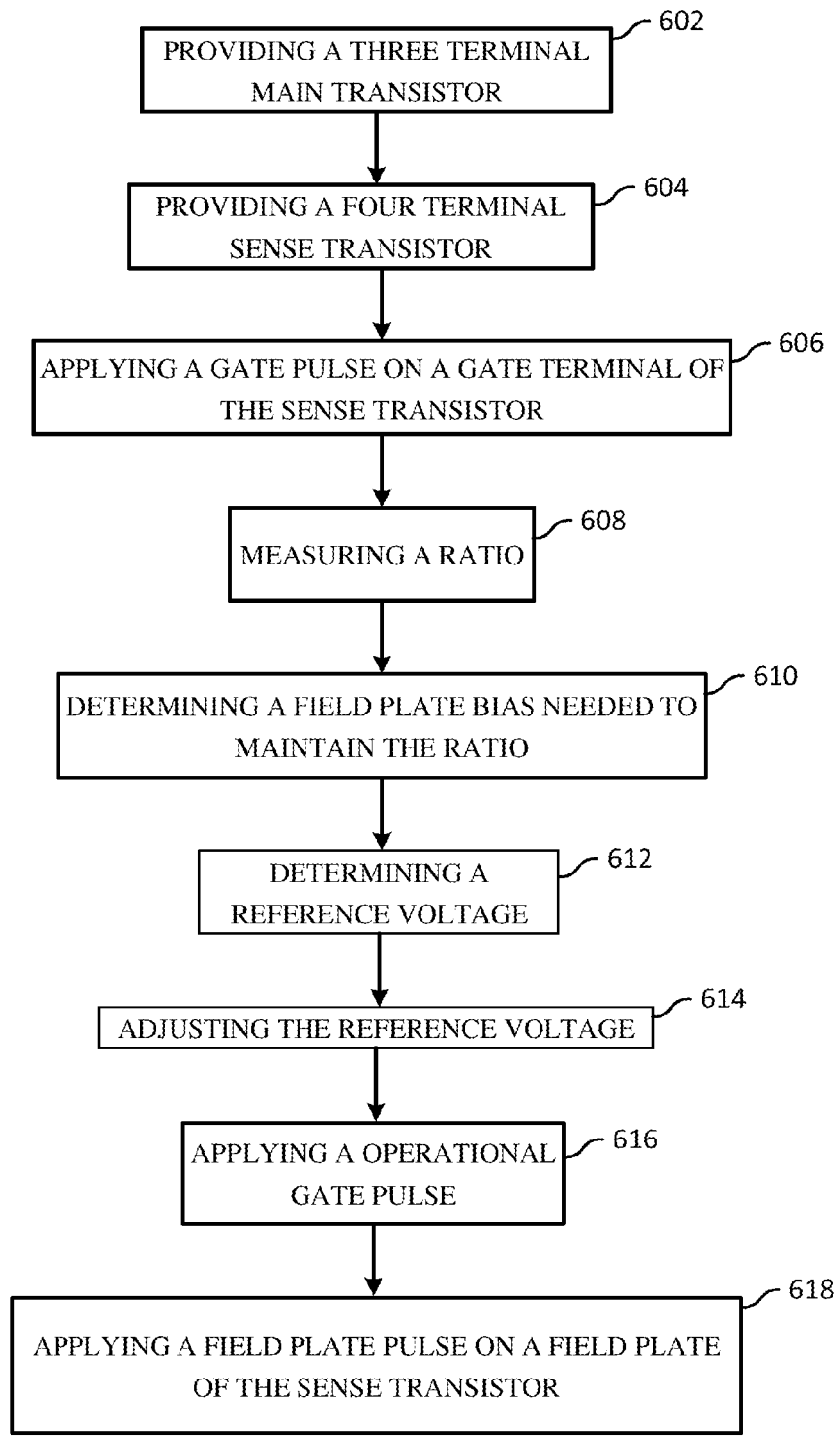
FIG. 9 illustrates an embodiment of implementing a $K_{ILIS}$ ratio trimming process.

FIG. 9 illustrates an embodiment of implementing a $K_{ILIS}$ ratio trimming process.

A three terminal main transistor and a four terminal sense transistor are obtained (Box 602 and 604). As described in various embodiments, the semiconductor chip includes a main transistor and a sense transistor. The main transistor may be a three terminal device whereas the sense transistor has an additional field plate electrode.

Before product use, the semiconductor chip undergoes testing or factory initialization. In some embodiments, the factory initialization may be performed during a user set up process. A gate pulse is applied on the gate terminals of the sense transistor and the main transistor (box 606). A $K_{ILIS}$ ratio is obtained (for example, by measuring the measured current output from the system on package of FIG. 7) (box 608). The $K_{ILIS}$ ratio is next adjusted to be within the proper target range for the product. Accordingly, a field plate bias needed to maintain the $K_{ILIS}$ ratio is obtained (box 610). A reference voltage is determined for the field plate bias to be applied during normal operation of the circuit based on the determined field plate bias (box 612). The reference voltage is adjusted for the trimming circuit (box 614). For example, a resistance of a variable resistor may be adjusted to drop a potential difference so as to adjust the reference voltage.

During subsequent normal operation of the product (or further product testing), an operational gate pulse is applied on the gate terminal of the sense transistor and the gate terminal of the main transistor (box 616). A field plate pulse is applied on the field plate of the sense transistor (box 618). The field plate pulse is synchronous and in phase with the operational gate pulse because of the common gate control command (e.g., common Gate Ctrl in FIG. 7). The reference voltage from the trimming circuit is used to correctly set the amplitude of the field plate pulse.

Accordingly, embodiments of the present invention may be used to correct and adjust the $K_{ILIS}$ ratio within a very tight specification, for example, within a range between −2% to 2%. In various embodiments, the sensitivity of the field plate may be adjusted, or set during a test process performed when the semiconductor chip is assembled into a package. In further embodiments, users of the assembled semiconductor package may also reformat or correct the trimming circuit responsible to adjust the field plate bias of the field plate of the sense transistor While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for operating a circuit comprising:
    providing a three terminal main transistor;
    providing a four terminal sense transistor comprising a field plate;
    simultaneously applying a gate pulse on a gate terminal of the sense transistor and a gate terminal of the main transistor; and
    applying a field plate pulse on a field plate of the sense transistor, wherein the field plate pulse is synchronous and in phase with the gate pulse.

2. The method of claim 1, wherein the field plate is capacitively coupled to a drift region of the sense transistor.

3. The method of claim 1, wherein the main transistor and the sense transistor comprise vertical transistors.

4. The method of claim 3, wherein the main transistor and the sense transistor comprise trench gate transistors.

5. The method of claim 1, wherein the main transistor and the sense transistor comprise lateral transistors.

6. The method of claim 5, wherein the lateral transistors comprise transistors disposed in a gallium nitride on silicon substrate.

7. A circuit comprising:
    a three terminal power transistor; and
    a four terminal sense transistor comprising a field plate, wherein a drain terminal of the four terminal sense transistor is coupled to a drain terminal of the three terminal power transistor, wherein a gate terminal of the four terminal sense transistor is coupled to a gate terminal of the three terminal power transistor, wherein the field plate is capacitively coupled to a drift region of the four terminal sense transistor, and wherein the field plate is not coupled to the other terminals of the four terminal sense transistor.

8. The circuit of claim 7, wherein the field plate is configured to adjust a resistance of the drift region of the four terminal sense transistor.

9. The circuit of claim 7, wherein the three terminal power transistor and the four terminal sense transistor comprise vertical trench gate transistors.

10. The circuit of claim 7, wherein the three terminal power transistor and the four terminal sense transistor comprise lateral transistors.

11. The circuit of claim 10, wherein the lateral transistors comprise transistors disposed in a gallium nitride on silicon substrate.

12. The circuit of claim 10, wherein the lateral transistors comprise drain extended MOS transistors, Lateral Double-Diffused MOS transistors, Double-Diffused Drain MOS transistors.

13. A method for performing an initialization of a circuit, the method comprising:
    providing a three terminal main transistor;
    providing a four terminal sense transistor comprising a field plate;
    applying a gate pulse on a gate terminal of the sense transistor and a gate terminal of the main transistor;
    measuring a ratio of a current through the main transistor and a current through the sense transistor; and
    determining a field plate bias needed to be applied at the field plate to maintain the ratio of the current through the main transistor to the current through the sense transistor with a target ratio.

14. The method of claim 13, wherein the target ratio is within −2% to +2%.

15. The method of claim 13, further comprising:
    determining a reference voltage for the field plate bias to be applied during normal operation of the circuit based on the determined field plate bias; and
    adjusting the reference voltage of the circuit.

16. The method of claim 15, further comprising:
    applying an operational gate pulse on a gate terminal of the sense transistor and a gate terminal of the main transistor; and
    applying a field plate pulse on a field plate of the sense transistor, wherein the field plate pulse is synchronous and in phase with the operational gate pulse.

17. A semiconductor device comprising:
- a three terminal main transistor disposed in a substrate and comprising a source contact, a drain contact, and a gate contact, the main transistor comprising
  - a first plurality of trenches disposed at a front side in a first region of the substrate, wherein each of the first plurality of trenches comprises a gate line coupled to the gate contact, and wherein portions of each of the first plurality of trenches not filled with material of the gate line comprise a dielectric material; and
- a four terminal sense transistor disposed in the substrate and comprising a source contact, a drain contact, a gate contact, and a field plate contact, the sense transistor comprising
  - a second plurality of trenches disposed at the front side in a second region of the substrate, wherein each of the second plurality of trenches comprises a gate line coupled to the gate contact, and wherein each of the second plurality of trenches comprises a field plate line coupled to the field plate contact, wherein the total number of trenches in the second plurality of trenches is different from the total number of trenches in the first plurality of trenches.

18. The device of claim 17, further comprising:
- first source regions disposed between adjacent first plurality of trenches; and
- second source regions disposed between adjacent second plurality of trenches.

19. The device of claim 18, further comprising:
- a common drain disposed at a back side of the substrate.

20. The device of claim 17, wherein the field plate line is capacitively coupled to a drift region of the sense transistor.

21. The device of claim 17, wherein the gate contact of the sense transistor is coupled to the gate contact of the main transistor.

\* \* \* \* \*